(12) United States Patent
Kim

(10) Patent No.: US 7,927,965 B2
(45) Date of Patent: Apr. 19, 2011

(54) METHOD FOR FABRICATING PARTIAL SOI SUBSTRATE

(75) Inventor: Myung-Ok Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/492,724

(22) Filed: Jun. 26, 2009

(65) Prior Publication Data

US 2010/0120218 A1 May 13, 2010

(30) Foreign Application Priority Data

Nov. 13, 2008 (KR) .................. 10-2008-0112789

(51) Int. Cl.
*H01L 21/76* (2006.01)
(52) U.S. Cl. ........................ 438/424; 257/347
(58) Field of Classification Search .................. 438/424, 438/272; 257/347
See application file for complete search history.

(56) References Cited

U.S. PATENT DOCUMENTS

2007/0259500 A1* 11/2007 Cheng et al. .................. 438/272
2008/0035998 A1    2/2008 Ramaswamy et al.
2009/0200635 A1*  8/2009 Koldiaev ....................... 257/506

OTHER PUBLICATIONS

"A Novel Body Effect Reduction Technique to REcessed Channel Transistor Featuring Partially Insulating Layer Under Source and Drain: Application to Sub-50nm DRAM Cell" Jong-Man Park et al., IEEE, 2007, pp. 903-906.*
Notice of Preliminary Rejection issued from Korean Intellectual Property Office on Feb. 16, 2011.

* cited by examiner

*Primary Examiner* — Matthew S Smith
*Assistant Examiner* — John M Parker
(74) *Attorney, Agent, or Firm* — IP & T Group LLP

(57) ABSTRACT

A method for fabricating a partial silicon-on-insulator (SOI) substrate is disclosed. The method for fabricating a partial silicon-on-insulator (SOI) substrate includes forming an insulation pattern over a first silicon layer, forming a second silicon layer over the substrate structure including the insulation pattern, etching the second silicon layer to form trenches, and forming device isolation regions filling the trenches.

18 Claims, 25 Drawing Sheets

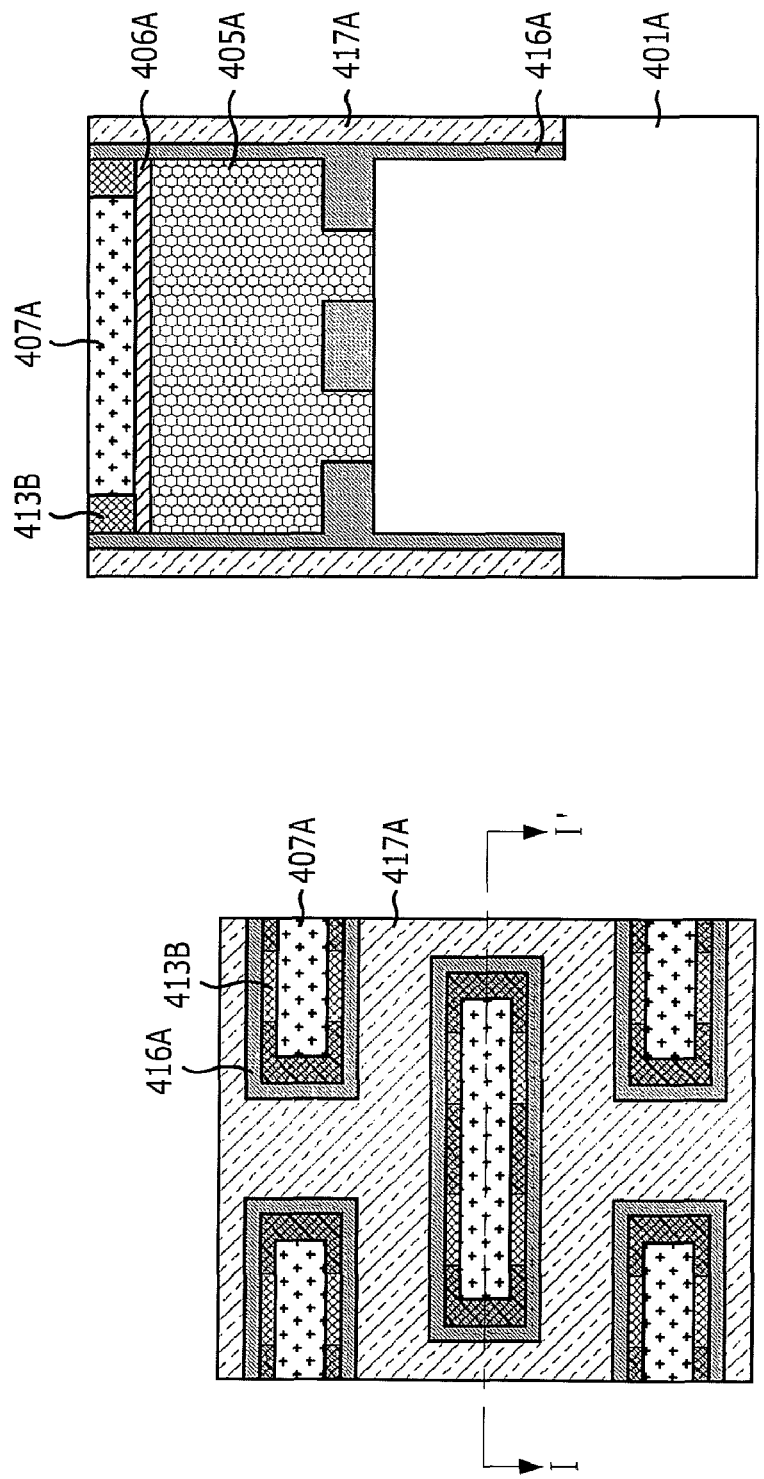

METHOD FOR FABRICATING PARTIAL SOI SUBSTRATE

CROSS-REFERENCE TO RELATED APPLICATIONS

The present invention claims priority of Korean patent application number 10-2008-0112789, filed on Nov. 13, 2008, the disclosure of which is incorporated herein by reference in its entirety.

BACKGROUND OF THE INVENTION

The present invention relates to a method for fabricating a semiconductor device, and more particularly, to a method for fabricating a partial silicon-on-insulator (SOI) substrate.

As semiconductor devices are becoming highly efficient, semiconductor integration technology using SOI wafer is drawing interest for replacing a single crystal silicon wafer with bulk silicon. The reason for drawing such interest is that a semiconductor device integrated on an SOI substrate has advantages over a typical semiconductor device integrated on a single crystal silicon substrate. The advantages include small junction capacitance resulting in a higher speed, low threshold voltage resulting in low voltage, and complete device isolation resulting in latch-up removal.

Meanwhile, a partial SOI process has been recently introduced. The partial SOI process refers to a process in which an insulation layer is formed locally in a stack structure including silicon/insulation/bulk silicon.

In FIG. 1 of a non-patent reference by Jong-man Park et al, entitled "A Novel Body Effect Reduction Technique to Recessed Channel Transistor Featuring Partially Insulating Layer Under Source and Drain: Application to Sub-50 nm DRAM Cell," International Electron Devices Meeting (IEDM) 2007, IEEE International, pp. 903-906, a method for fabricating a partial SOI substrate is illustrated.

FIGS. 1A to 1F illustrate cross-sectional views of a method for fabricating a typical partial SOI substrate.

Referring to FIG. 1A, a silicon germanium (SiGe) layer 102 is formed over a first silicon layer 101, and a second silicon layer 103 is formed over the silicon germanium layer 102.

Referring to FIG. 1B, certain portions of the second silicon layer 103 and the silicon germanium layer 102 are etched for forming a partial SOI substrate. Reference numbers 102A and 103A represent a silicon germanium pattern 102A and a second silicon pattern 103A, respectively.

Referring to FIG. 1C, a third silicon layer 104 is formed over the substrate structure. The silicon germanium pattern 102A represents regions where a partial SOI is to be formed.

Referring to FIG. 1D, the third silicon layer 104, the second silicon pattern 103A, and the first silicon layer 101 are etched to form trenches 105. The silicon germanium pattern 102A is also etched when forming the trenches 105. Reference numbers 101A, 102B, 103B, and 104A represent a remaining first silicon layer 101A, a remaining silicon germanium pattern 102B, a remaining second silicon pattern 103B, and a remaining third silicon layer 104A, respectively.

Referring to FIG. 1E, the remaining silicon germanium pattern 102B (shown in FIG. 1D) exposed by the trenches 105 is removed. As a result, portions where the remaining silicon germanium pattern 102B used to be become spaces 106.

Referring to FIG. 1F, an insulation layer is formed over the substrate structure in a manner that the insulation layer fills the trenches 105 and the spaces 106 to form a device isolation region 107.

As described above, the method for fabricating a typical partial SOI substrate includes a formation process of the silicon germanium layer 102 between the first silicon layer 101 and the second silicon layer 103, and a selective removal process performed when forming the device isolation region 107, thereby forming a partial SOI in an active region. Using a partial SOI substrate allows maintaining a high threshold voltage and controlling extension of charge depletion.

However, the typical method generally requires performing an epitaxial growth process at least three times. The processes are shown in the typical method described above where the silicon germanium layer 102, the second silicon layer 103, and the third silicon layer 104 are formed. Therefore, the cost of the process increases due to the complexity and issues related to mass-production.

Also, when the second silicon layer 103 and the silicon germanium layer 102 are etched to form the second silicon pattern 103A and the silicon germanium pattern 102A in FIG. 1B, respectively, the silicon germanium pattern 102A is exposed, causing contamination of the chamber by germanium (Ge).

Furthermore, a high temperature may not be applied to the silicon germanium pattern 102A in a subsequent process because inner diffusion may occur at a high temperature. Thus, a thermal budget may be decreased.

For a metallic element such as germanium, diffusion may occur depending on chamber contamination and temperature.

Therefore, a high temperature may not be used when forming the third silicon layer 104. As a result, a long period of time may be needed to form the third silicon layer 104 and the quality of the layer may be deteriorated.

SUMMARY OF THE INVENTION

Embodiments of the present invention are directed to providing a method for fabricating a partial silicon-on-insulator (SOI) substrate, which can reduce diffusion resulting from chamber contamination by a metallic element and temperature.

The embodiments of the present invention are also directed to providing a method for fabricating a partial SOI substrate, which can secure mass-productivity and simplify the process.

The embodiments of the present invention are also directed to providing a method for fabricating a partial SOI substrate, which can reduce a thermal budget and improve silicon layer quality.

In accordance with an aspect of the present invention, there is provided a method for fabricating a partial SOI substrate, which includes: forming an insulation pattern over a first silicon layer; forming a second silicon layer over the substrate structure; etching the second silicon layer to form trenches; and forming device isolation regions filling the trenches.

The forming of the insulation pattern may include using a layer including a nonmetallic element.

The forming of the insulation pattern may include using an oxide-based layer.

The forming of the insulation pattern and the forming of the device isolation regions may include using an oxide-based layer.

Before forming the second silicon layer, removing contaminants and damaged layers over the first silicon layer may be performed.

The forming of the second silicon layer may include performing an epitaxial growth, and the epitaxial growth may be performed at a temperature ranging from approximately 650° C. to approximately 900° C.

After forming the second silicon layer, planarizing the second silicon layer may be performed.

The forming of the insulation pattern may include forming the insulation pattern in a line type or pillar type shape.

In accordance with an aspect of the present invention, there is provided a method for fabricating a partial SOI substrate, which includes forming a sacrificial pattern including a nonmetallic element over a first silicon layer, forming a second silicon layer over the substrate structure, etching the second silicon layer to form trenches, removing the sacrificial pattern exposed by the trenches, and forming device isolation regions filling the trenches.

The forming of the sacrificial pattern may include using a nitride-based layer.

The etching of the second silicon layer to form the trenches may include forming a hard mask pattern over the second silicon layer, forming spacer patterns over sidewalls of the hard mask pattern, and etching the second silicon layer and the first silicon layer using the hard mask pattern and the spacer patterns.

The forming of the spacer patterns may include using a material having a low wet etch rate with respect to the sacrificial pattern, and the forming of the spacer patterns may include using an oxide-based layer.

The removing of the sacrificial pattern may include performing a wet etch, and using phosphoric acid.

In accordance with an aspect of the present invention, there is provided a method for fabricating a partial silicon-on-insulator (SOI) substrate. The method comprises forming an insulation pattern to partially cover a first silicon layer, forming a second silicon layer over the insulation pattern and other areas of the substrate, etching the second silicon layer to form trenches, forming a passivation layer over side surfaces of the trenches, and forming, over the passivation layer, device isolation regions to fill the trenches.

BRIEF DESCRIPTION OF THE DRAWINGS

FIGS. 4A to 15B illustrate cross-sectional views of a method for fabricating a partial SOI substrate in accordance with a third embodiment of the present invention.

DESCRIPTION OF SPECIFIC EMBODIMENTS

Other objects and advantages of the present invention can be understood by the following description, and become apparent with reference to the embodiments of the present invention.

Embodiments of the present invention relate to a method for fabricating a partial silicon-on-insulator (SOI) substrate, which uses a layer including a nonmetallic element as an insulation and metal pattern. In this way, diffusion resulting from chamber contamination from a metallic element and temperature may be reduced. Also, the process may be simplified by reducing the number of times an epitaxial growth process is performed.

Furthermore, layer quality of a silicon layer may be improved when performing an epitaxial growth process due to an increased thermal budget.

In particular, the process may be further simplified when using an oxide-based layer as an insulation pattern because a removal process may be omitted after forming trenches.

FIGS. 2A to 2H illustrate cross-sectional views of a method for fabricating a partial SOI substrate in accordance with a first embodiment of the present invention.

Figure 2A:
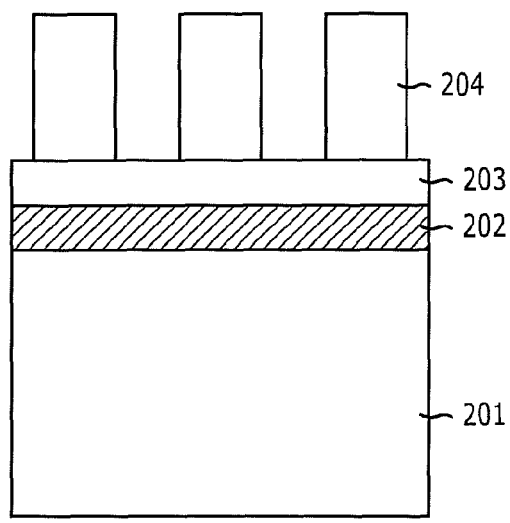
FIGS. 2A to 2H illustrate cross-sectional views of a method for fabricating a partial SOI substrate in accordance with a first embodiment of the present invention.

Referring to FIG. 2A, an insulation layer 202 is formed over a first silicon layer 201. The insulation layer 202 is formed to form a subsequent partial SOI. For instance, the insulation layer 202 may include a layer including a nonmetallic element. In particular, the insulation layer 202 may include an oxide-based layer. The insulation layer 202 may be formed using a method selected from a group consisting of a chemical vapor deposition (CVD) method, a physical vapor deposition (PVD) method and an atomic layer deposition (ALD) method.

An anti-reflective coating layer 203 is formed over the insulation layer 202. The anti-reflective coating layer 203 is formed to reduce reflection during a photo-exposure process when forming a first photoresist pattern 204.

A hard mask layer may be additionally formed to secure an etch margin before forming the anti-reflective coating layer 203.

The first photoresist pattern 204 is formed over the anti-reflective coating layer 203. The first photoresist pattern 204 is patterned in a manner to define partial SOI regions. At this time, the first photoresist pattern 204 may be formed in a line type or pillar type pattern.

Figure 2B:
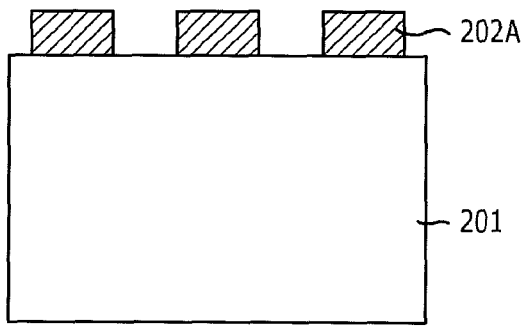

Referring to FIG. 2B, the anti-reflective coating layer 203 (shown in FIG. 2A) and the insulation layer 202 (shown in FIG. 2A) are etched using the first photoresist pattern 204 (shown in FIG. 2A) as an etch barrier to form an insulation pattern 202A. The insulation pattern 202A may be formed in substantially the same shape as the first photoresist pattern 204, i.e., a line type or pillar type pattern.

After forming the insulation pattern 202A, the first photoresist pattern 204 and remaining portions of the anti-reflective coating layer 203 are removed. The removal process may include performing an oxygen removal process. Also, a cleaning process may be performed after the removal process is performed.

At this time, the insulation pattern 202A is exposed to the air. However, contamination of the chamber may be prevented because the insulation pattern 202A does not include a metallic element, which acts a chamber contaminant.

Figure 2C:
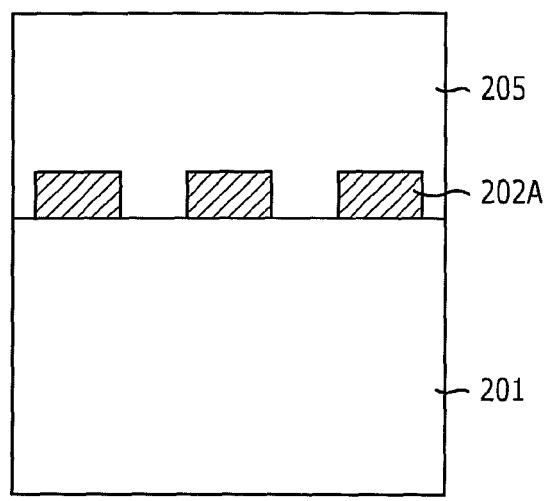

Referring to FIG. 2C, a second silicon layer 205 is formed over the substrate structure. The second silicon layer 205 is formed using an epitaxial growth process. For instance, the second silicon layer 205 may be formed by growing a bulk silicon at a temperature ranging from approximately 650° C. to approximately 900° C.

Before forming the second silicon layer 205, a cleaning process is performed to remove contaminants and damaged portions over the first silicon layer 201. The cleaning process may be performed to improve layer quality when forming the second silicon layer 205 by removing contaminants and plasma damage layers generated by the etching. For instance, the cleaning process may include performing a post etch treatment (PET) or a light etch treatment (LET).

Furthermore, after forming the second silicon layer 205, a planarization process is performed on a surface of the second silicon layer 205. The planarization process may include performing a chemical mechanical polishing (CMP) process.

As described above, contamination of the chamber by a metallic element may be prevented by forming a layer including a nonmetallic element as the insulation pattern 202A. Also, an epitaxial growth may be performed at a high temperature, achieving high mass-productivity and a sufficient level of layer quality. Furthermore, the process may be simplified since an epitaxial growth process is performed one time when forming the second silicon layer 205.

Figure 2D:
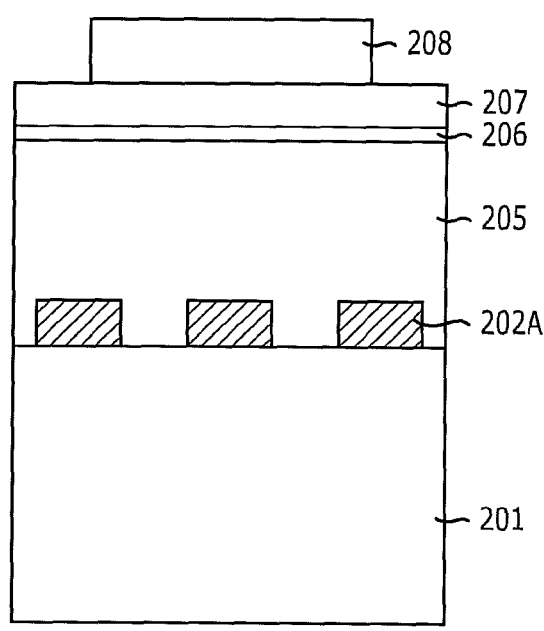

Referring to FIG. 2D, a pad oxide layer 206 and a pad nitride layer 207 are formed over the second silicon layer 205. The pad nitride layer 207 is formed to be used as an etch barrier when forming subsequent trenches.

A second photoresist pattern 208 is formed over the pad nitride layer 207. The second photoresist pattern 208 is patterned in a manner to expose device isolation regions. That is, the second photoresist pattern 208 defines an active region. For instance, a final inspection critical dimension (FICD) of the second photoresist pattern 208 may be controlled in consideration of a critical dimension of a subsequent pad nitride pattern and an etch bias.

Figure 2E:
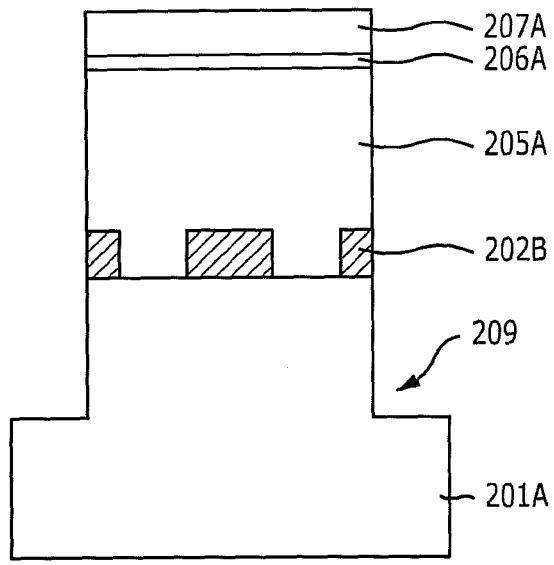

Referring to FIG. 2E, the pad nitride layer 207 is etched using the second photoresist pattern 208 (shown in FIG. 2D) as an etch barrier. Reference number 207A represents an etched pad nitride layer 207A.

The second photoresist pattern 208 may be removed. For instance, the second photoresist pattern 208 may be removed using an oxygen removal process.

The pad oxide layer 206 and the second silicon layer 205 are etched using the etched pad nitride layer 207A as an etch barrier to form trenches 209 defining an active region. Reference numbers 205A and 206A represent an etched second silicon layer 205A and an etched pad oxide layer 206A, respectively.

When forming the trenches 209, portions of the insulation pattern 202A and the first silicon layer 201 are also etched. Reference numbers 201A and 202B represent an etched first silicon layer 201A and an etched insulation pattern 202B, respectively.

Figure 2F:
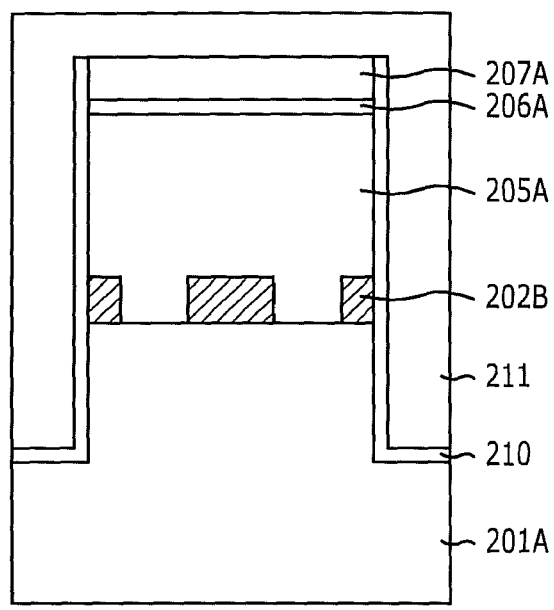

Referring to FIG. 2F, passivation layers 210 are formed over the surface profile of the trenches 209. The passivation layers 210 may include a stack structure of a sidewall oxide layer and a liner nitride layer.

At this time, the etched insulation pattern 202B formed between the passivation layers 210, the etched first silicon layer 201A, and the etched second silicon layer 205A becomes a partial SOI.

An insulation structure 211 is formed over the substrate structure to fill the trenches 209. The insulation structure 211 may include one of a spin on dielectric (SOD) layer, a high density plasma (HDP) oxide layer, and a stack structure including both an SOD layer and a HDP oxide layer.

Figure 2G:
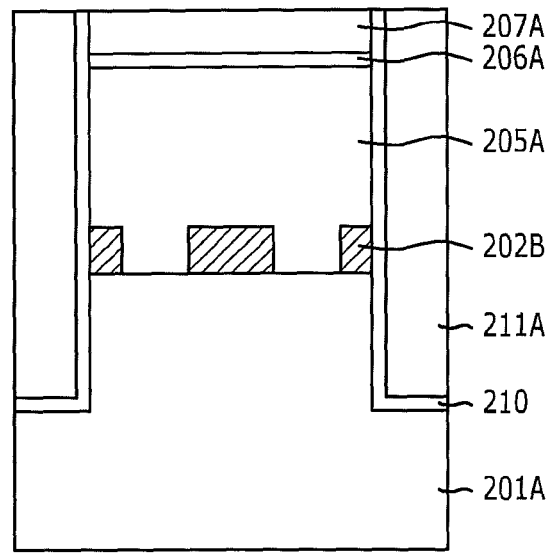

Referring to FIG. 2G, the insulation structure 211 (shown in FIG. 2F) is etched and polished until a surface of the etched pad nitride layer 207A is exposed to form device isolation regions 211A. At this time, the polishing process may include performing a CMP process.

Figure 2H:
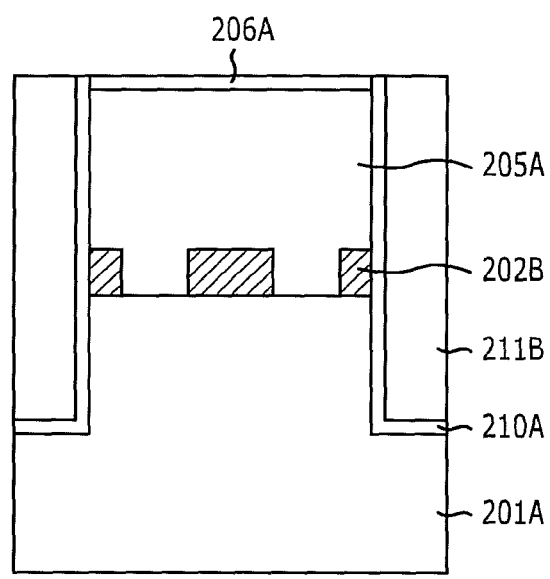

Referring to FIG. 2H, the etched pad nitride layer 207A (shown in FIG. 2G) is removed. For instance, the etched pad nitride layer 207A may be removed using phosphoric acid.

A cleaning process is performed. During the cleaning process, a certain thickness of the device isolation regions 211A is lost. Thus, remaining device isolation regions 211B having substantially the same height as the etched pad oxide layer 206A are formed. Reference number 210A represents remaining passivation layers 210A.

Figure 1A:
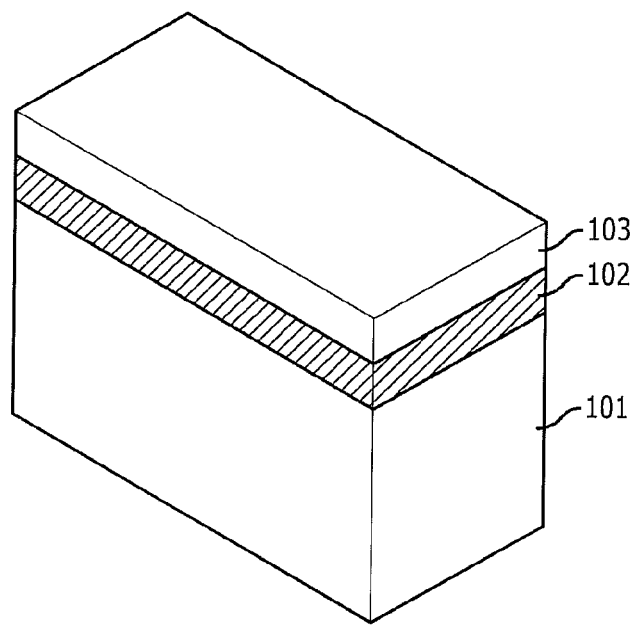
FIGS. 1A to 1F illustrate cross-sectional views of a method for fabricating a conventional partial silicon-on-insulator (SOI) substrate.
Figure 1B:
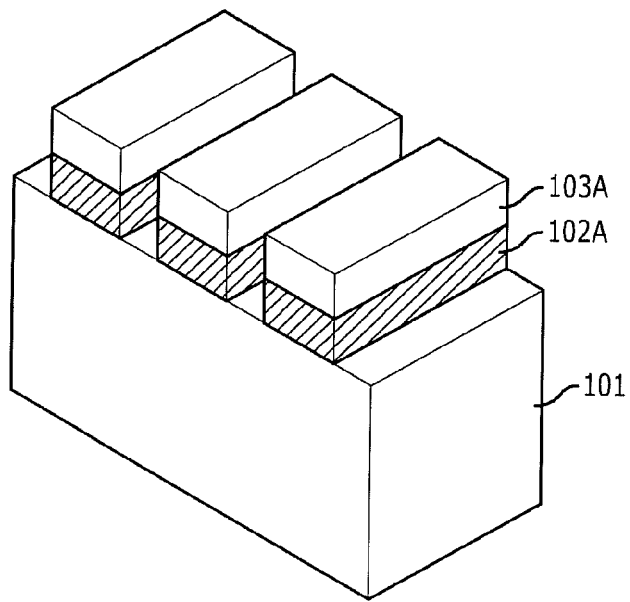
Figure 1C:
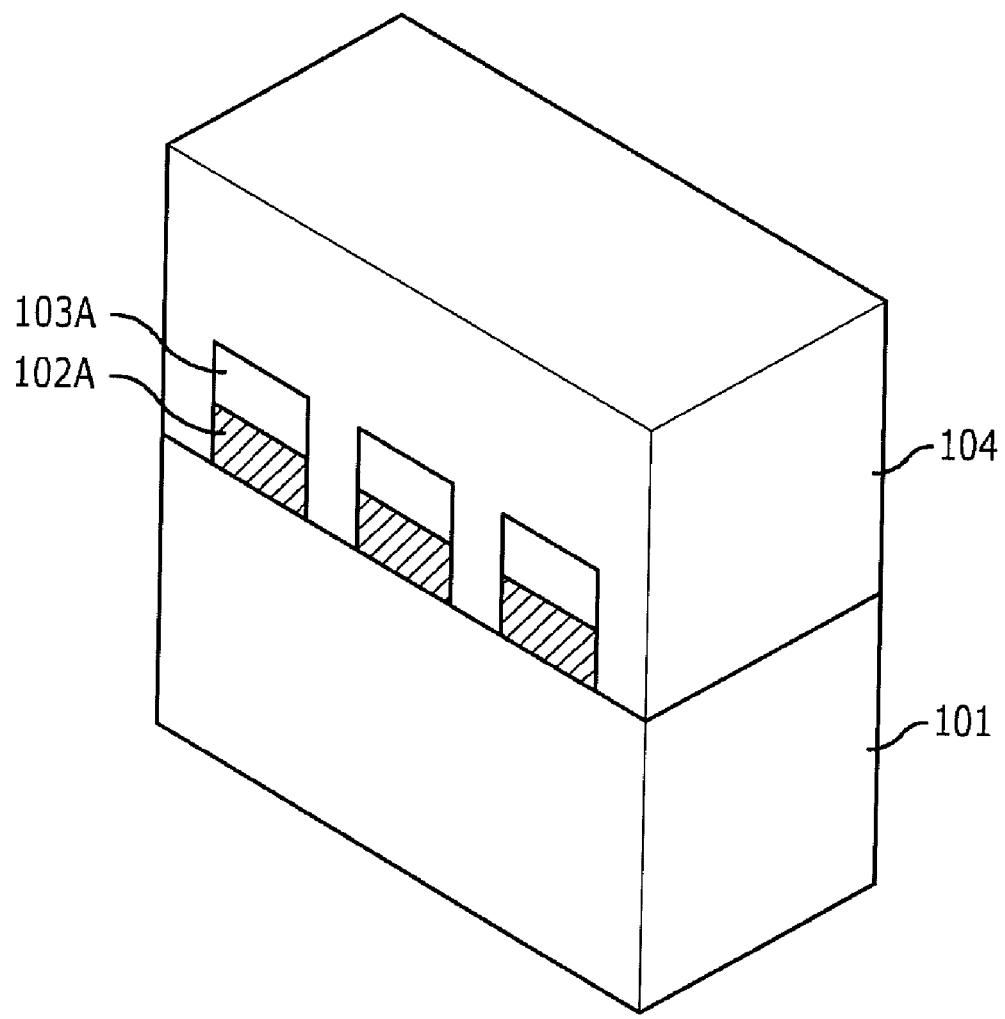
Figure 1D:
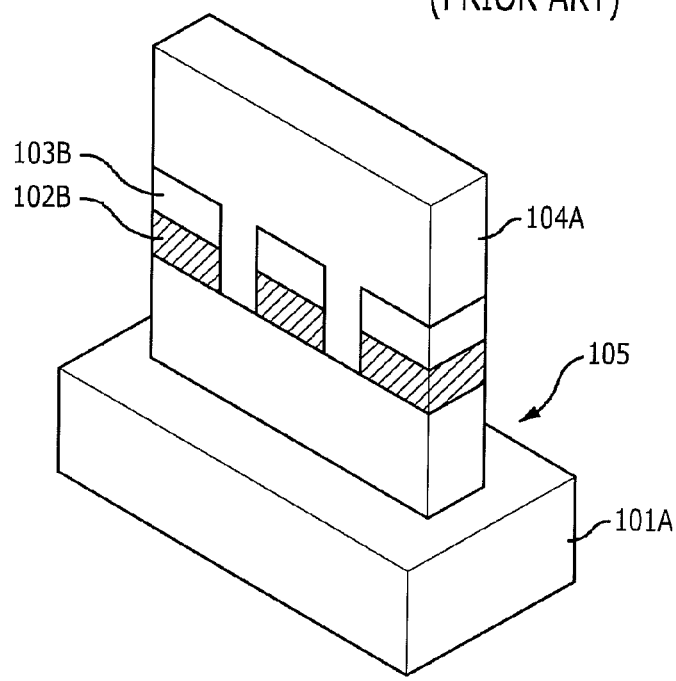
Figure 1E:
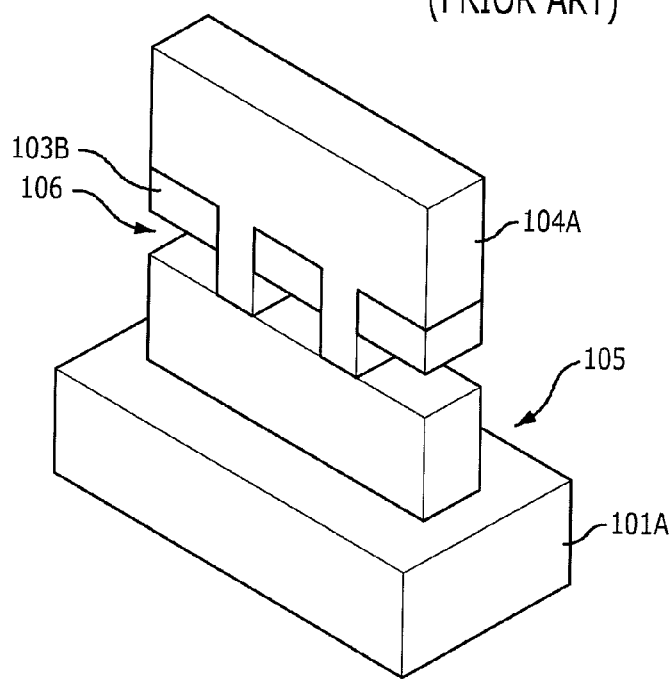
Figure 1F:
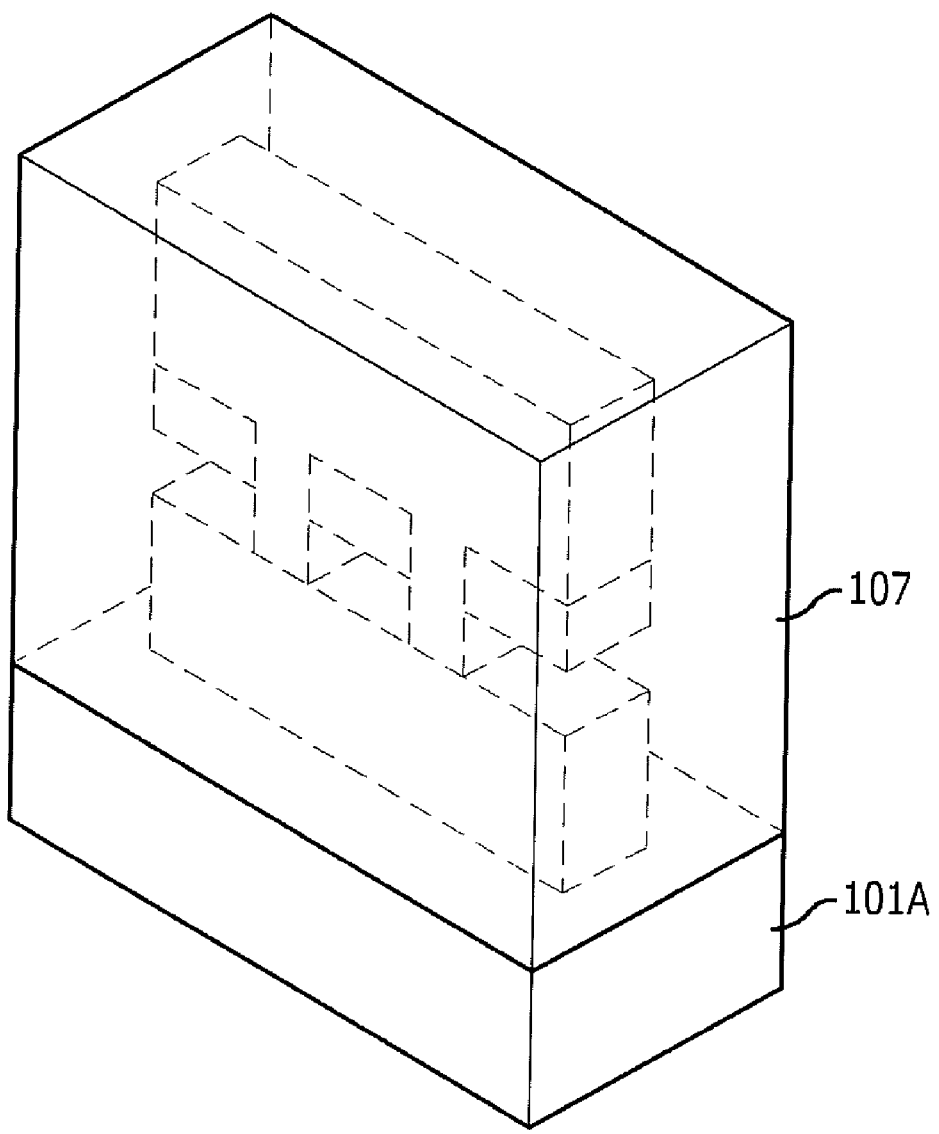

As described above, using an oxide-based layer as the etched insulation pattern 202B simplifies the process since a removal process of a silicon germanium layer may be omitted as shown in FIG. 1E of the typical method.

FIGS. 3A to 3I illustrate cross-sectional views of a method for fabricating a partial SOI substrate in accordance with a second embodiment of the present invention.

Figure 3A:
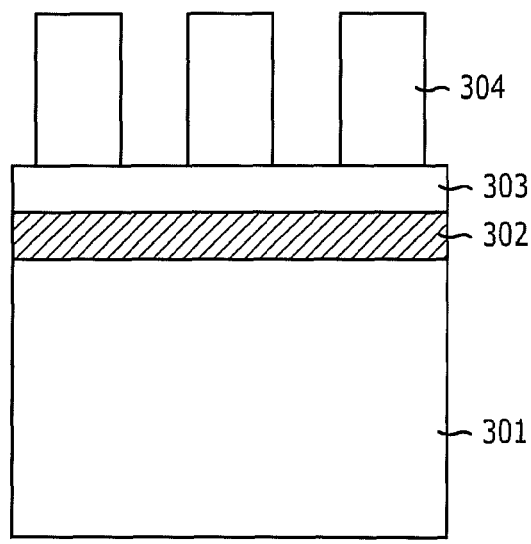
FIGS. 3A to 3I illustrate cross-sectional views of a method for fabricating a partial SOI substrate in accordance with a second embodiment of the present invention.

Referring to FIG. 3A, a sacrificial layer 302 is formed over a first silicon layer 301. The sacrificial layer 302 is formed to form a subsequent partial SOI. For instance, the sacrificial layer 302 may include a layer including a nonmetallic element. For instance, the sacrificial layer 302 may include a material which has a high wet etch rate with respect to the first silicon layer 301 and a subsequent second silicon layer, as well as having a high wet etch rate with respect to a subsequent pad nitride layer.

The sacrificial layer 302 may be formed using a method selected from a group consisting of a chemical vapor deposition (CVD) method, a physical vapor deposition (PVD) method, and an atomic layer deposition (ALD) method.

An anti-reflective coating layer 303 is formed over the sacrificial layer 302. The anti-reflective coating layer 303 is formed to reduce reflection during a photo-exposure process when forming a first photoresist pattern 304. Before forming the anti-reflective coating layer 303, a hard mask layer may be additionally formed to secure an etch margin.

The first photoresist pattern 304 is formed over the anti-reflective coating layer 303. The first photoresist pattern 304 is patterned in a manner to define partial SOI regions. At this time, the first photoresist pattern 304 may be patterned in a line type or pillar type pattern. For instance, the first photoresist pattern 304 is formed in a pillar type pattern in order to make a subsequent removal process of the sacrificial layer 302 easier.

Figure 3B:
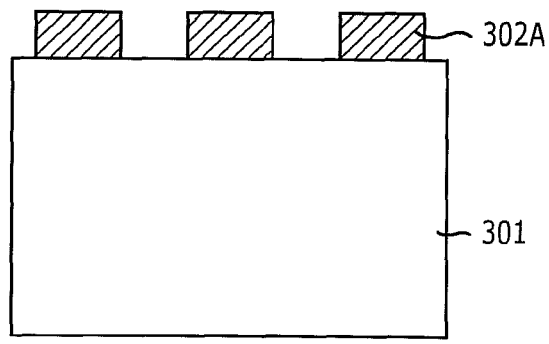

Referring to FIG. 3B, the anti-reflective coating layer 303 (shown in FIG. 3A) and the sacrificial layer 302 (shown in FIG. 3A) are etched using the first photoresist pattern 304 (shown in FIG. 3A) as an etch barrier to form a sacrificial pattern 302A. The sacrificial pattern 302A may be formed in substantially the same shape as the first photoresist pattern 304, i.e., a line type or pillar type pattern.

After forming the sacrificial pattern 302A, first photoresist pattern 304 and remaining portions of the anti-reflective coating layer 303 are removed. The removal process may include performing an oxygen removal process. Also, a cleaning process may be performed after the removal process is performed.

At this time, the sacrificial pattern 302A is exposed to the air. However, contamination of the chamber may be prevented because the sacrificial pattern 302A does not include a metallic element which is a chamber contaminant.

Figure 3C:
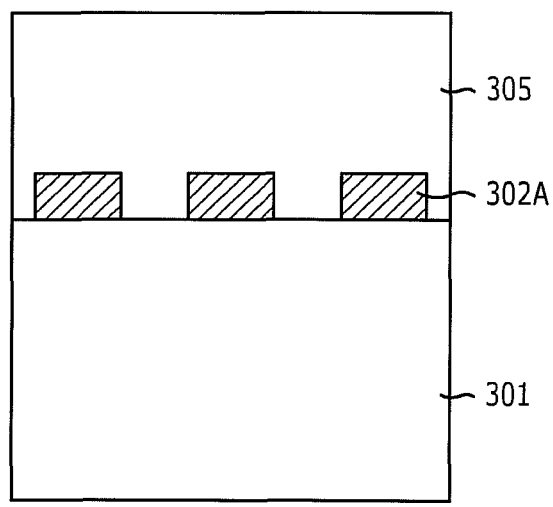

Referring to FIG. 3C, a second silicon layer 305 is formed over the substrate structure. The second silicon layer 305 is formed using an epitaxial growth process. For instance, the second silicon layer 305 may be formed by growing a bulk silicon at a temperature ranging from approximately 650° C. to approximately 900° C.

Before forming the second silicon layer 305, a cleaning process is performed to remove contaminants and damaged portions over the first silicon layer 301. The cleaning process may be performed to improve layer quality when forming the second silicon layer 305 by removing contaminants and plasma damage layers generated by the etching. For instance, the cleaning process may include performing a post etch treatment (PET) or a light etch treatment (LET).

Furthermore, after forming the second silicon layer 305, a planarization process is performed on a surface of the second silicon layer 305. The planarization process may include performing a chemical mechanical polishing (CMP) process.

As described above, contamination of the chamber by a metallic element may be prevented by forming a layer including a nonmetallic element as the sacrificial pattern 302A. Also, an epitaxial growth may be performed at a high temperature, achieving high mass-productivity and a sufficient level of layer quality. Furthermore, the process may be simplified since an epitaxial growth process is performed one time when forming the second silicon layer 305.

Figure 3D:
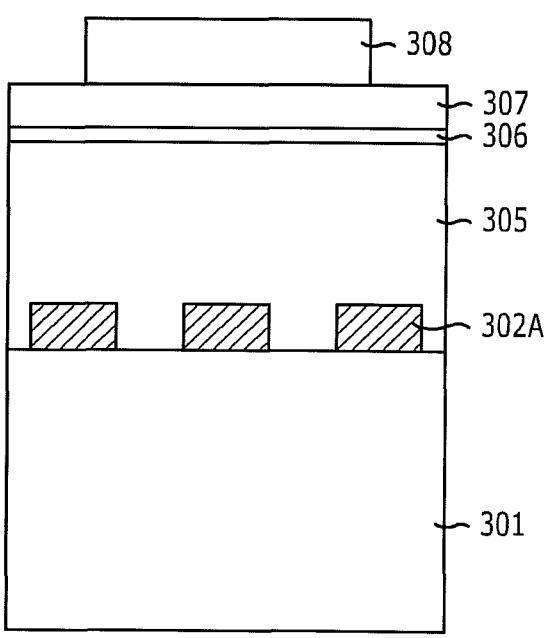

Referring to FIG. 3D, a pad oxide layer 306 and a pad nitride layer 307 are formed over the second silicon layer 305. The pad nitride layer 307 is formed to be used as an etch barrier when forming subsequent trenches. If the sacrificial pattern 302A includes a nitride-based layer, an oxide-based layer may be additionally formed over the pad nitride layer 307 to prevent a loss of the pad nitride layer 307 during a subsequent removal process of the sacrificial pattern 302A.

A second photoresist pattern 308 is formed over the pad nitride layer 307. The second photoresist pattern 308 is patterned in a manner to expose device isolation regions. That is, the second photoresist pattern 308 defines an active region. For instance, a final inspection critical dimension (FICD) of the second photoresist pattern 308 may be controlled in consideration of a critical dimension of a subsequent pad nitride pattern and an etch bias.

Figure 3E:
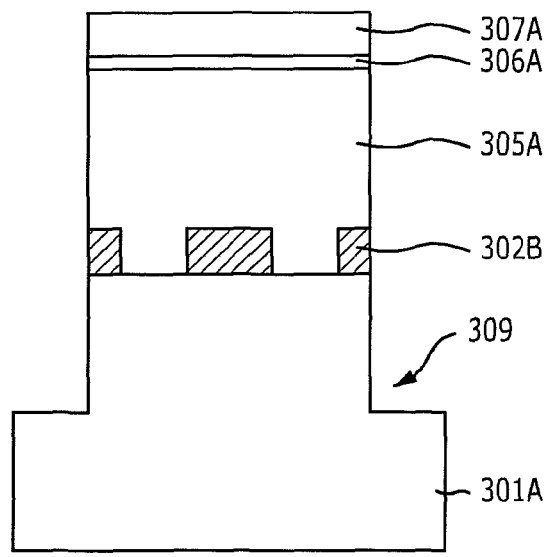

Referring to FIG. 3E, the pad nitride layer 307 is etched using the second photoresist pattern 308 (shown in FIG. 3D) as an etch barrier. Reference number 307A represents an etched pad nitride layer 307A.

The second photoresist pattern 308 may be removed. For instance, the second photoresist pattern 308 may be removed using an oxygen removal process.

The pad oxide layer 306 and the second silicon layer 305 are etched using the etched pad nitride layer 307A as an etch barrier to form trenches 309 defining an active region. Reference numbers 305A and 306A represent an etched second silicon layer 305A and an etched pad oxide layer 306A, respectively.

When forming the trenches 309, portions of the sacrificial pattern 302A and the first silicon layer 301 are also etched and thus exposed by the trenches 309. Reference numbers 301A and 302B represent an etched first silicon layer 301A and an etched sacrificial pattern 302B, respectively.

Figure 3F:
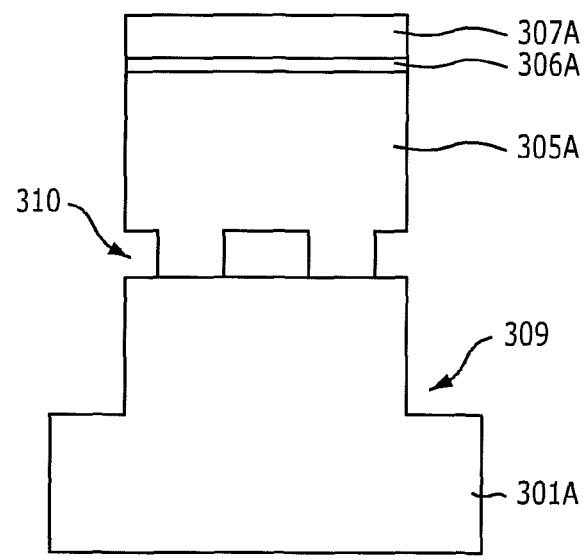

Referring to FIG. 3F, the exposed etched sacrificial pattern 302B (shown in FIG. 3E) is removed. For instance, the etched sacrificial pattern 302B is removed using a wet etch process, having a selectivity with respect to silicon.

After removing the etched sacrificial pattern 302B, portions where the etched sacrificial pattern 302B used to be become spaces 310.

Figure 3G:
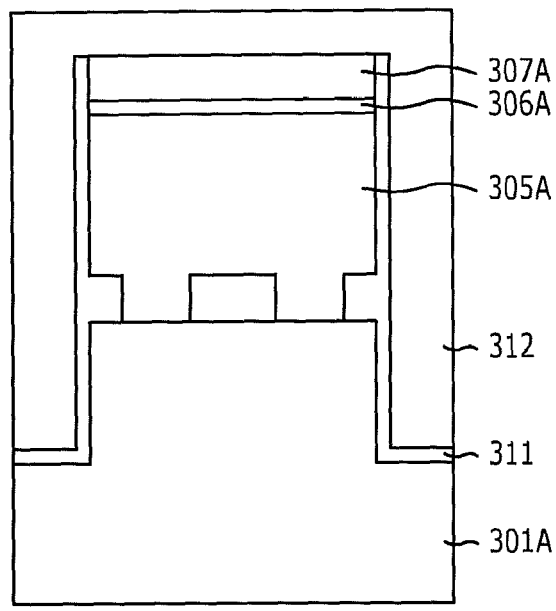

Referring to FIG. 3G, passivation layers 311 are formed over the surface profile of the spaces 310 (shown in FIG. 3F) and the trenches 309. The passivation layers 311 may include a stack structure of a sidewall oxide layer and a liner nitride layer. In particular, the spaces 310 are substantially filled by the passivation layers 311, thereby forming a partial SOI.

An insulation layer 312 is formed over the passivation layers 311, filling the trenches 309. The insulation layer 312 may include one of a spin on dielectric (SOD) layer, a high density plasma (HDP) oxide layer, and a stack structure including both an SOD layer and a HDP oxide layer.

Figure 3H:
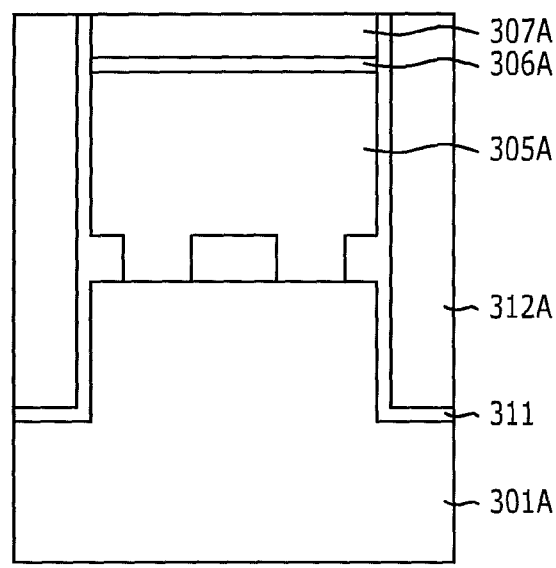

Referring to FIG. 3H, the insulation layer 312 (shown in FIG. 3G) is etched and polished until a surface of the etched pad nitride layer 307A is exposed to form device isolation regions 312A. At this time, the polishing process may include performing a CMP process.

Figure 3I:
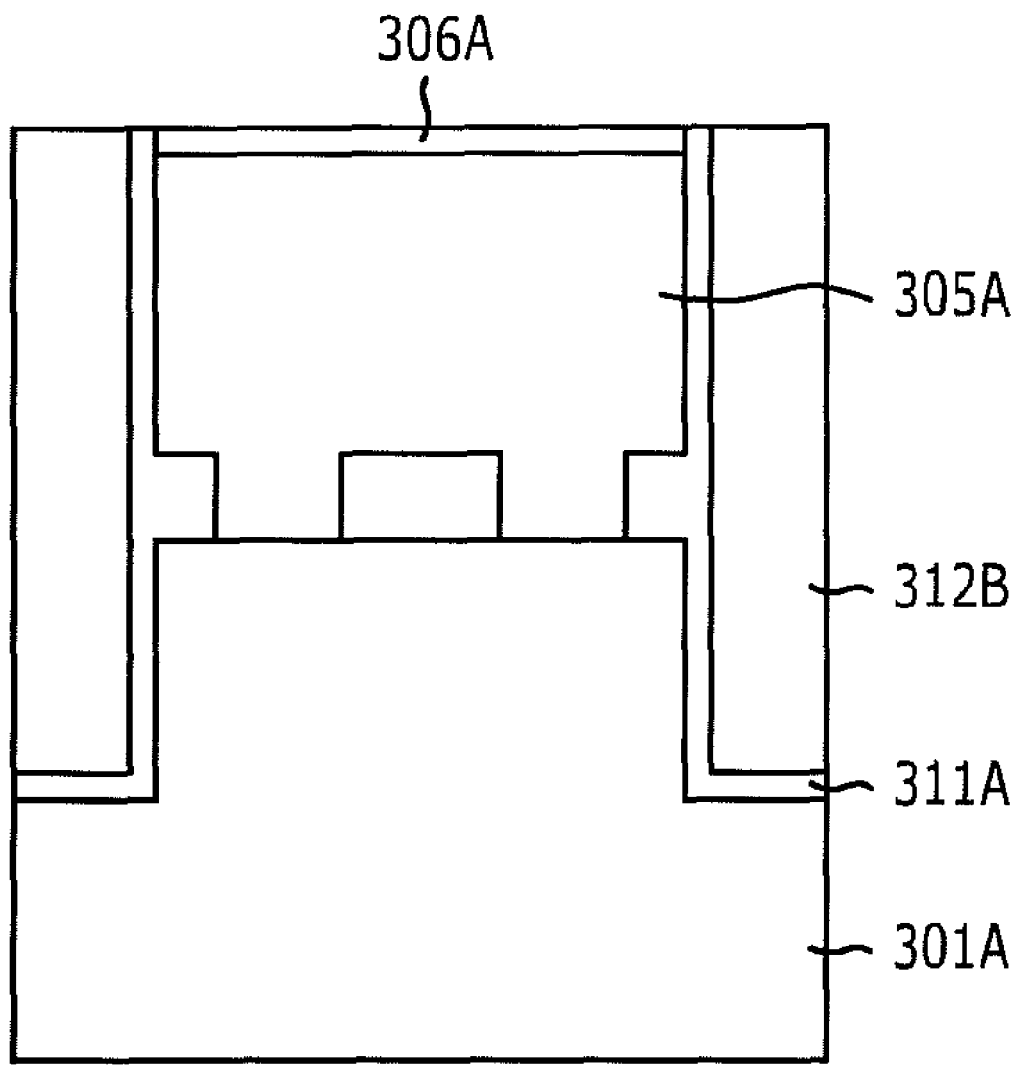

Referring to FIG. 3I, the etched pad nitride layer 307A (shown in FIG. 3H) is removed. For instance, the etched pad nitride layer 307A may be removed using phosphoric acid.

A cleaning process is performed. During the cleaning process, a certain thickness of the device isolation regions 312A is lost. Thus, remaining device isolation regions 312B having substantially the same height as the etched pad oxide layer 306A are formed. Reference number 311A represents remaining passivation layers 311A.

FIGS. 4A to 15B illustrate cross-sectional views of a method for fabricating a partial SOI substrate in accordance with a third embodiment of the present invention. FIGS. 4A, 5A, 6A, 7A, 8A, 9A, 10A, 11A, 12A, 13A, 14A, and 15A show plan view layouts of the method for fabricating a partial SOI substrate, and FIGS. 4B, 5B, 6B, 7B, 8B, 9B, 10B, 11B, 12B, 13B, 14B, and 15B show sectional views of the method for fabricating a partial SOI substrate taken along a line I-I'. The plan view layouts and the sectional views are shown side by side for convenience of description.

Figure 4B:
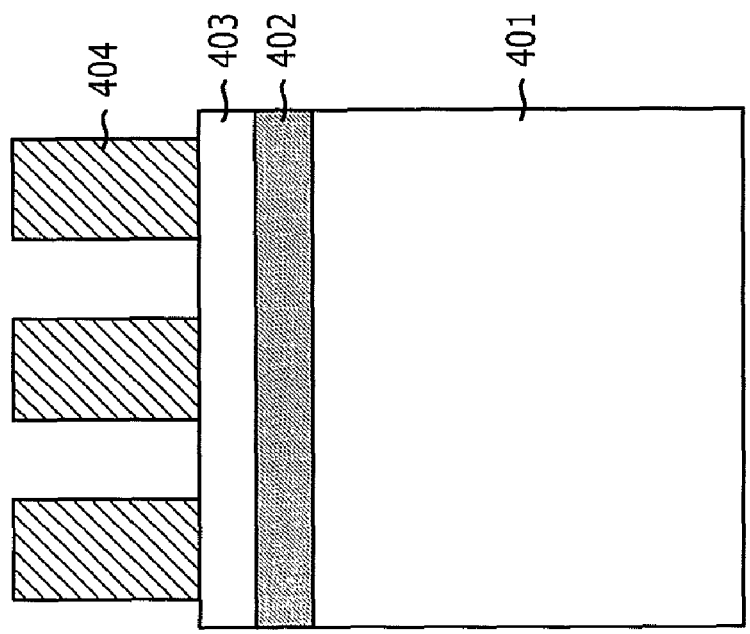
Figure 4A:
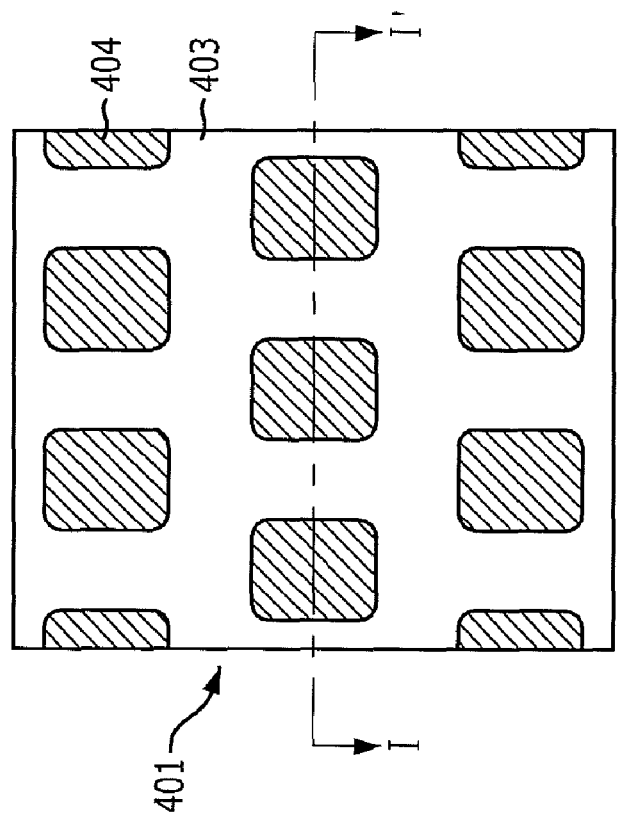

Referring to FIGS. 4A and 4B, a sacrificial layer 402 is formed over a first silicon layer 401. The sacrificial layer 402 is formed to form a subsequent partial SOI. For instance, the sacrificial layer 402 may include a layer including a nonmetallic element. In particular, the sacrificial layer 402 may be formed using a material having a high wet etch rate with respect to the first silicon layer 401. For instance, the sacrificial layer 402 may include a nitride-based layer. In this third embodiment of the present invention, a case where a nitride-based layer is used as the sacrificial layer 402 is described. The sacrificial layer 402 may be formed using a method selected from a group consisting of a chemical vapor deposition (CVD) method, a physical vapor deposition (PVD) method, and an atomic layer deposition (ALD) method.

A first anti-reflective coating layer 403 is formed over the sacrificial layer 402. The first anti-reflective coating layer 403 is formed to reduce reflection during a photo-exposure process when forming a first photoresist pattern 404. A hard mask layer may be additionally formed to secure an etch margin before forming the first anti-reflective coating layer 403.

The first photoresist pattern 404 is formed over the first anti-reflective coating layer 403. The first photoresist pattern 404 is patterned in a manner to define partial SOI regions. At this time the first photoresist pattern 404 may be formed in a line type or pillar type pattern. For instance, the first photoresist pattern 404 may be formed in a pillar type pattern to make a subsequent removal process of the sacrificial layer 402 easier.

Figure 5B:
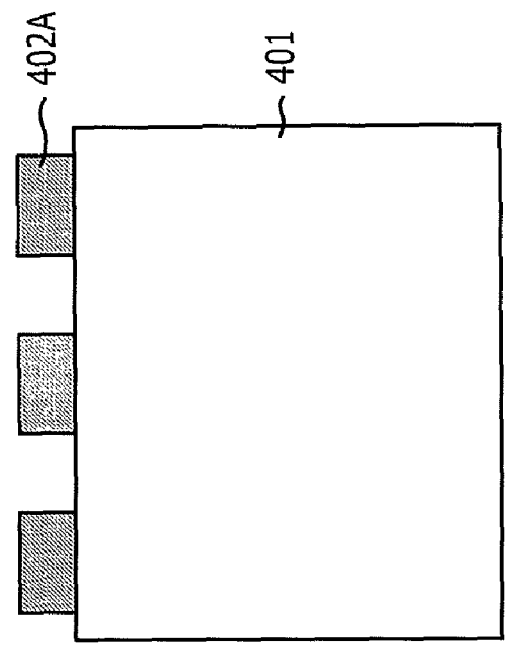
Figure 5A:
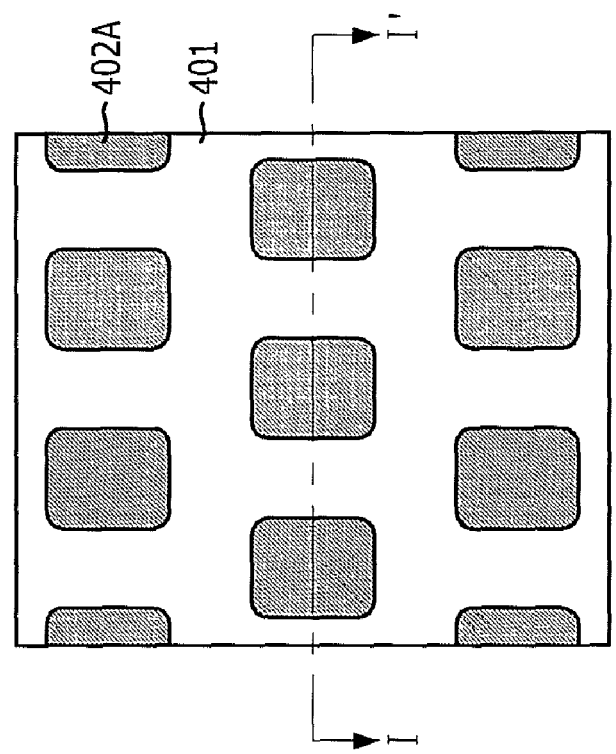

Referring to FIGS. 5A and 5B, the first anti-reflective coating layer 403 (shown in FIGS. 4A and 4B) and the sacrificial layer 402 (shown in FIG. 4B) are etched using the first photoresist pattern 404 (shown in FIGS. 4A and 4B) as an etch barrier to form a sacrificial pattern 402A. The sacrificial pattern 402A is formed in substantially the same shape as the first photoresist pattern 404, i.e., a line type or pillar type pattern.

After the sacrificial pattern 402A is formed, the first photoresist pattern 404 and remaining portions of the first anti-reflective coating layer 403 are removed. The removal process may include performing an oxygen removal process. Also, a cleaning process may be performed after the removal process.

Chamber contamination by a metallic element may be prevented because the sacrificial pattern 402A is formed using a nitride-based layer, i.e., a nonmetallic element.

For instance, the sacrificial pattern 402A may have a greater final inspection critical dimension (FICD) than the minor axis of a subsequent active region because the sacrificial pattern 402A is to be exposed while forming trenches for subsequent device isolation regions.

Figure 6B:
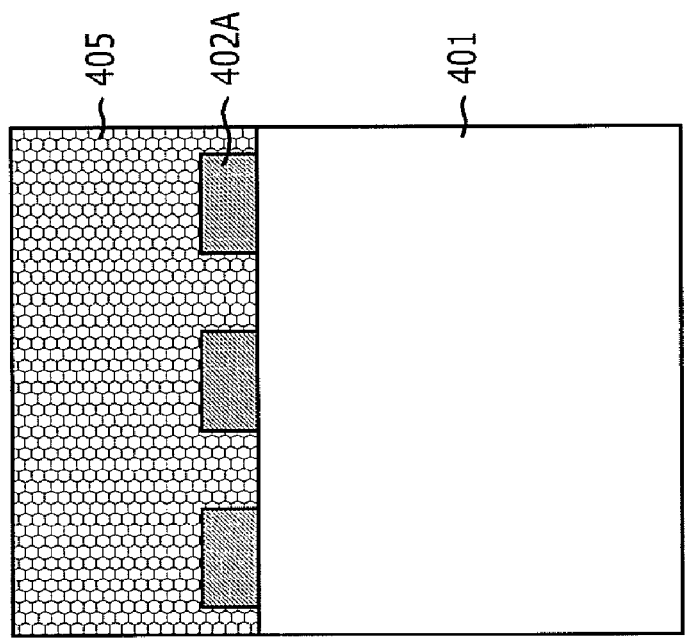
Figure 6A:
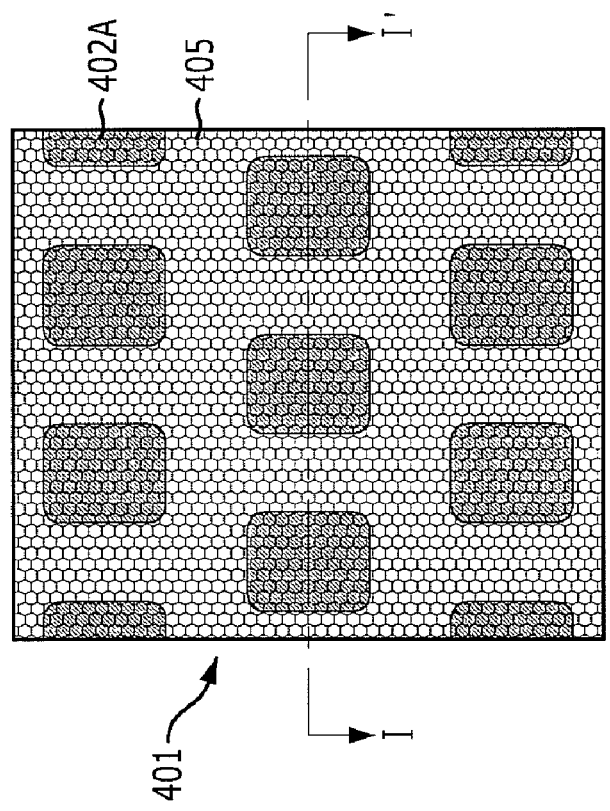

Referring to FIGS. 6A and 6B, a second silicon layer 405 is formed over the substrate structure. The second silicon layer 405 may be formed by performing an epitaxial growth process. For instance, the second silicon layer 405 may be formed by growing a bulk silicon at a temperature ranging from approximately 650° C. to approximately 900° C.

Before forming the second silicon layer 405, a cleaning process may be performed to remove contaminants and damaged portions over the first silicon layer 401. The cleaning process may be performed to improve layer quality when forming the second silicon layer 405 by removing contaminants and plasma damage layers generated by the etching. For instance, the cleaning process may include performing a post etch treatment (PET) or a light etch treatment (LET).

Furthermore, after forming the second silicon layer 405, a planarization process is performed on a surface of the second silicon layer 405. The planarization process may include performing a chemical mechanical polishing (CMP) process.

As described above, contamination of the chamber by a metallic element may be prevented by forming a nitride-based layer, i.e., a nonmetallic element, as the sacrificial pattern 402A. Also, an epitaxial growth may be performed at a high temperature, achieving high mass-productivity and a sufficient level of layer quality. Furthermore, the process may be simplified since an epitaxial growth process is performed one time when forming the second silicon layer 405.

Figure 7B:
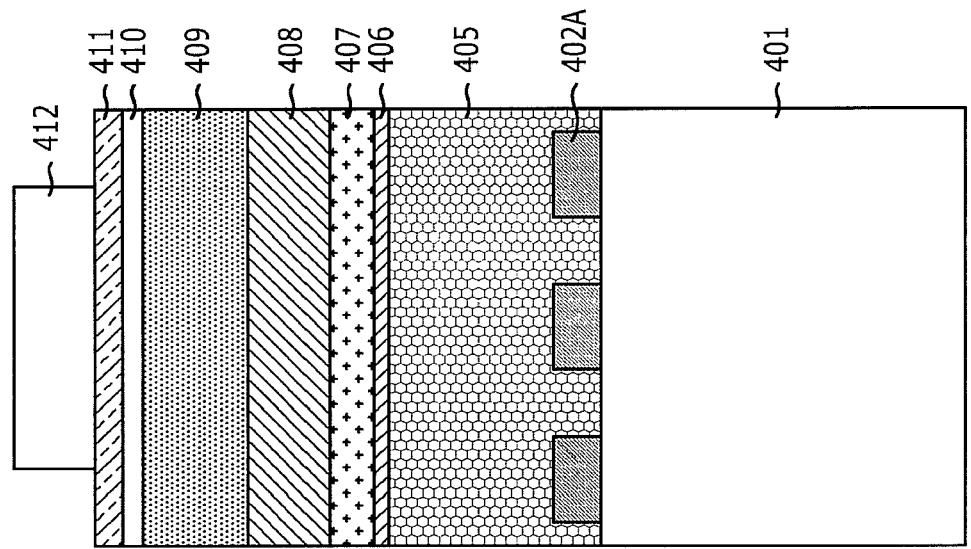
Figure 7A:
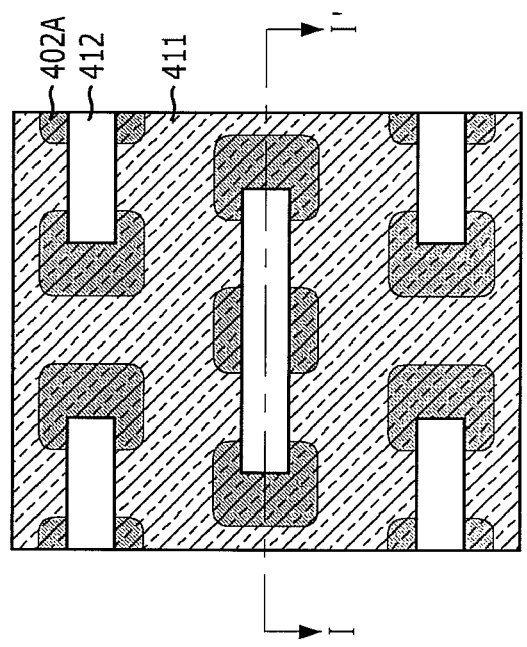

Referring to FIGS. 7A and 7B, a pad oxide layer 406 and a pad nitride layer 407 are formed over the second silicon layer 405. The pad nitride layer 407 is formed to be used as an etch barrier when forming subsequent trenches.

A hard mask oxide layer 408 is formed over the pad nitride layer 407. The hard mask oxide layer 408 is formed to prevent the pad nitride layer 407 from getting removed during a subsequent removal process of the sacrificial pattern 402A. The hard mask oxide layer 408 may be formed using one selected from a group consisting of low pressure tetraethyl orthosilicate (LPTEOS), plasma enhanced tetraethyl orthosilicate (PETEOS), thermal oxide, undoped silicate glass (USG), middle temperature oxide (MTO), high temperature oxide (HTO), and high density plasma (HDP) oxide.

For instance, the hard mask oxide layer 408 may be formed in a manner that the hard mask oxide layer 408 has a remaining thickness of approximately 200 Å or greater while forming subsequent trenches. If the hard mask oxide layer 408 has a very small thickness or if the hard mask oxide layer 408 is removed, the hard mask oxide layer 408 may not be able to protect the pad nitride layer 407.

A hard mask layer 409 is formed over the hard mask oxide layer 408. The hard mask layer 409 is formed to etch the hard mask oxide layer 408 and the pad nitride layer 407. The hard mask layer 409 may include a carbon-based material, and the carbon-based material may include amorphous carbon.

A silicon oxynitride (SiON) layer 410 is formed over the hard mask layer 409. The silicon oxynitride layer 410 is formed to etch the hard mask layer 409. Together with a subsequent second anti-reflective coating layer 411, the silicon oxynitride layer 410 reduces reflection during a photo-exposure process for forming a second photoresist pattern 412.

The second anti-reflective coating layer 411 is formed over the silicon oxynitride layer 410. The second anti-reflective coating layer 411 reduces reflection during a photo-exposure process for forming the second photoresist pattern 412.

The second photoresist pattern 412 is formed over the second anti-reflective coating layer 411. The second photoresist pattern 412 is formed to expose device isolation regions. That is, the second photoresist pattern 412 defines an active region. For instance, a final inspection critical dimension (FICD) of the second photoresist pattern 412 may be controlled in consideration of a critical dimension of a subsequent pad nitride pattern, a thickness of a spacer pattern and an etch bias.

Figures 8A, 8B:
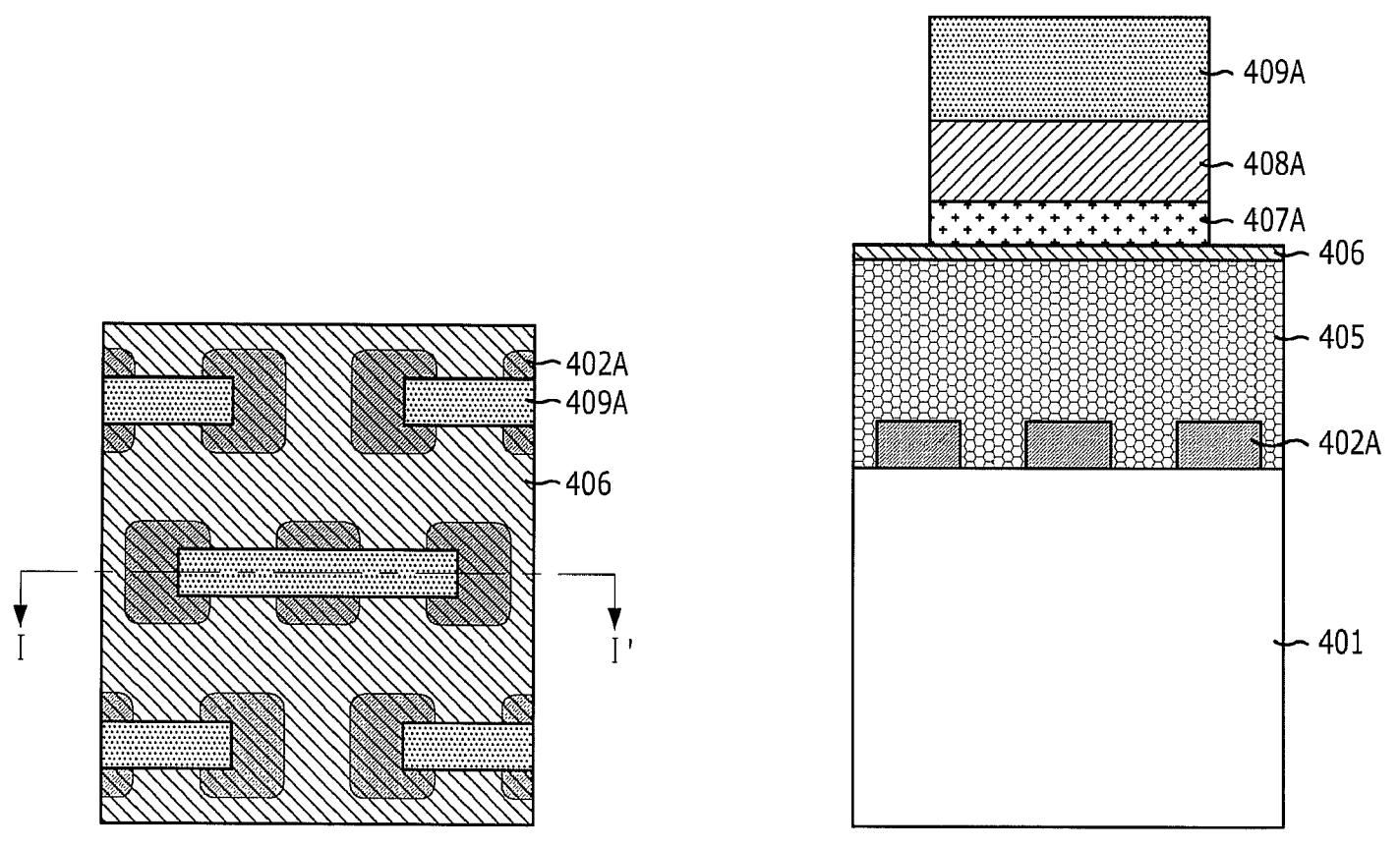

Referring to FIGS. 8A and 8B, the second anti-reflective coating layer 411 (shown in FIGS. 7A and 7B) and the silicon oxynitride layer 410 (shown in FIG. 7B) are etched using the second photoresist pattern 412 (shown in FIGS. 7A and 7B) as an etch barrier.

The hard mask layer 409 is etched to form a hard mask pattern 409A using remaining portions of the silicon oxynitride layer 410 as an etch barrier. By the time the hard mask pattern 409A is formed, the second photoresist pattern 412 and remaining portions of the second anti-reflective coating layer 411 are removed.

The hard mask oxide layer 408 and the pad nitride layer 407 are etched using the hard mask pattern 409A as an etch barrier. Reference numbers 407A and 408A represent a pad nitride pattern 407A and a hard mask oxide pattern 408A, respectively.

By the time the pad nitride pattern 407A is formed, the remaining portions of the silicon oxynitride layer 410 are removed.

From the etching of the second anti-reflective coating layer 411 to the formation of the pad nitride pattern 407A, the process may be performed in-situ or ex-situ.

In other embodiments, the etching may be performed in a manner that the etching stops at the pad oxide layer 406, or the etching may continue until a certain thickness of the second silicon layer 405 is etched after the pad oxide layer 406 is etched.

Figure 9B:
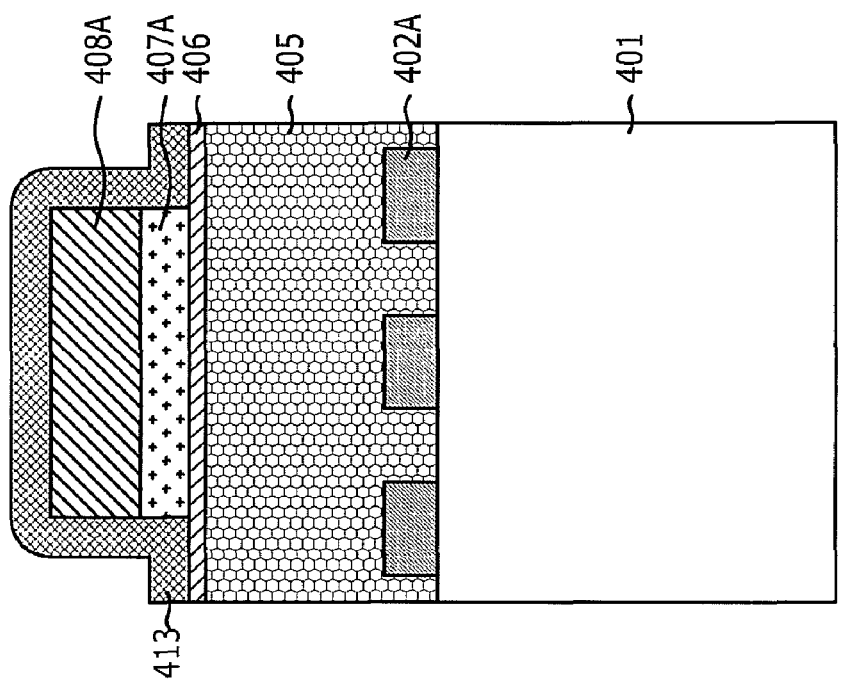
Figure 9A:
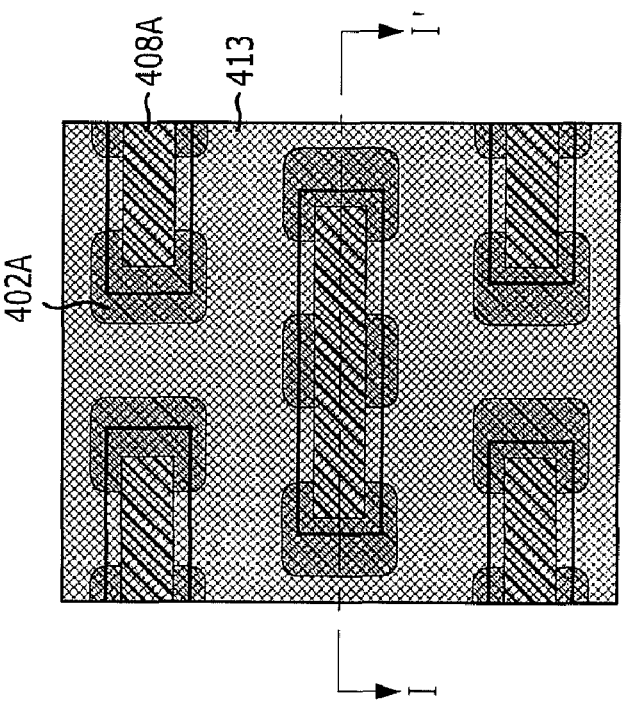

Referring to FIGS. 9A and 9B, the hard mask pattern 409A (shown in FIGS. 8A and 8B) is removed. The hard mask pattern 409A may be removed in a plasma etch chamber in-situ or in a plasma remover. For instance, the hard mask pattern 409A may be removed using a plasma including a mixed gas of nitrogen ($N_2$) and oxygen ($O_2$) so that damages may not occur in lower layers.

A spacer layer 413 is formed over the surface profile of the substrate structure. The spacer layer 413 is formed to reduce a loss of the pad nitride pattern 407A during a subsequent removal process of the sacrificial pattern 402A. The spacer layer 413 may include a material having a selectivity with respect to the sacrificial pattern 402A and the pad nitride pattern 407A. For instance, the spacer layer 413 may include an oxide-based layer. In particular, the spacer layer 413 may include an oxide-based layer having a sufficiently high level of step coverage.

Figure 10B:
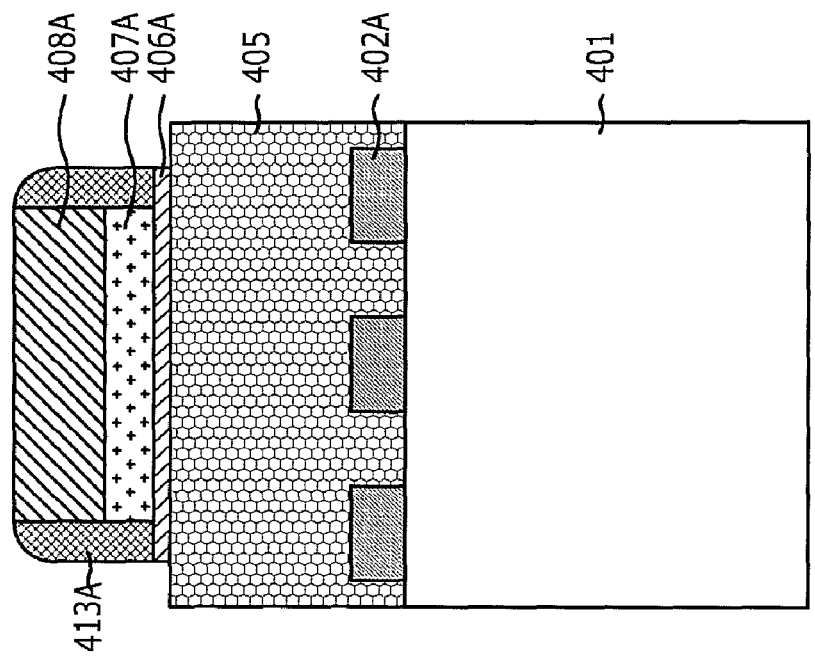
Figure 10A:
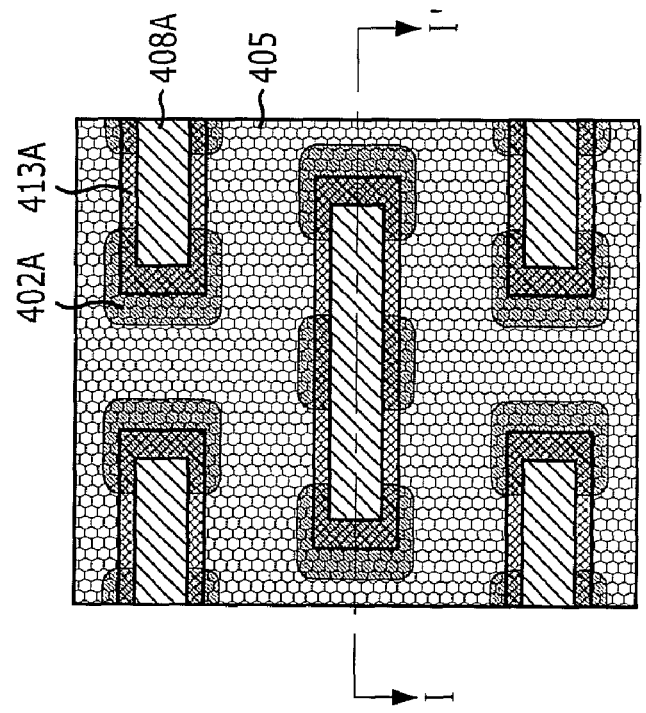

Referring to FIGS. 10A and 10B, the spacer layer 413 is etched to form spacer patterns 413A over sidewalls of the pad nitride pattern 407A and the hard mask oxide pattern 408A. For instance, the spacer layer 413 may be etched until portions of the second silicon layer 405 are exposed. Reference number 406A represents a pad oxide pattern 406A.

The pad nitride pattern 407A is isolated from the outside by forming the hard mask oxide pattern 408A over the pad nitride pattern 407A and the spacer patterns 413A over the sidewalls of the pad nitride pattern 407A.

Figure 11B:
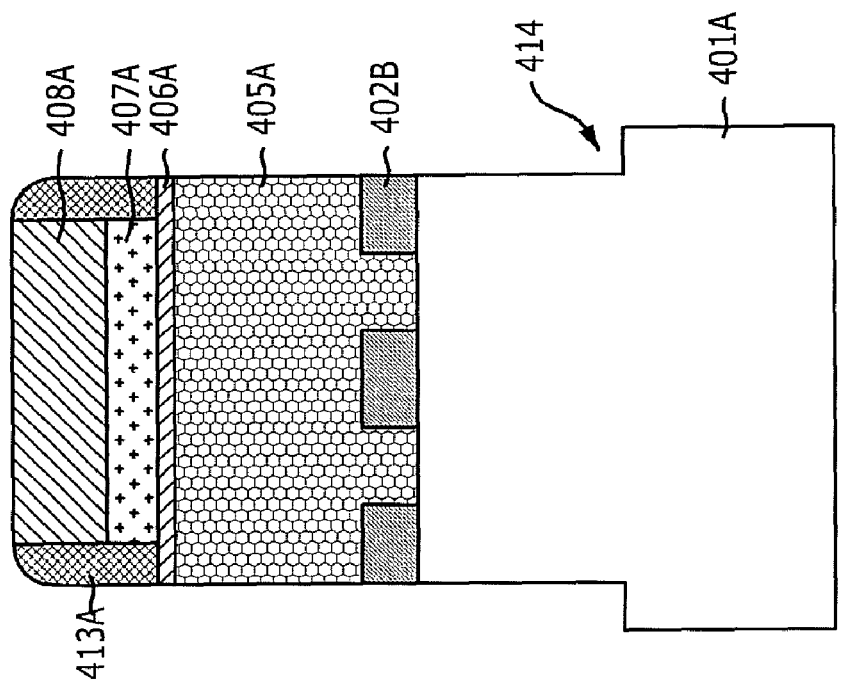
Figure 11A:
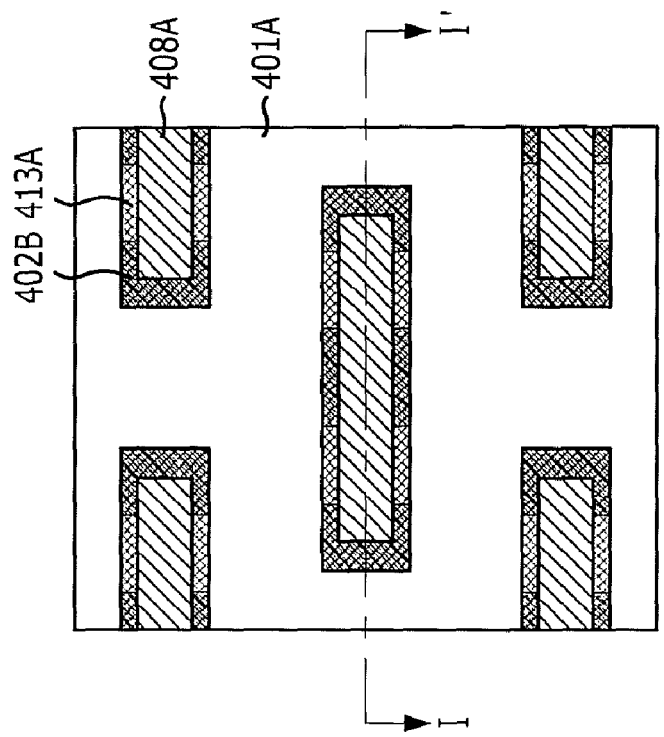

Referring to FIGS. 11A and 11B, the second silicon layer 405 is etched using the hard mask oxide pattern 408A and the spacer patterns 413A as an etch barrier to form trenches 414 defining an active region. At this time, portions of the first silicon layer 401 and the sacrificial pattern 402A are also etched. Reference numbers 401A, 402B, and 405A represent an etched first silicon layer 401A, an etched sacrificial pattern 402B, and an etched second silicon layer 405A, respectively.

By the time the trenches 414 are formed, the hard mask oxide pattern 408A remains over the pad nitride pattern 407A with a thickness of approximately 200 Å or greater. The etched sacrificial pattern 402B is exposed by the trenches 414.

Figure 12B:
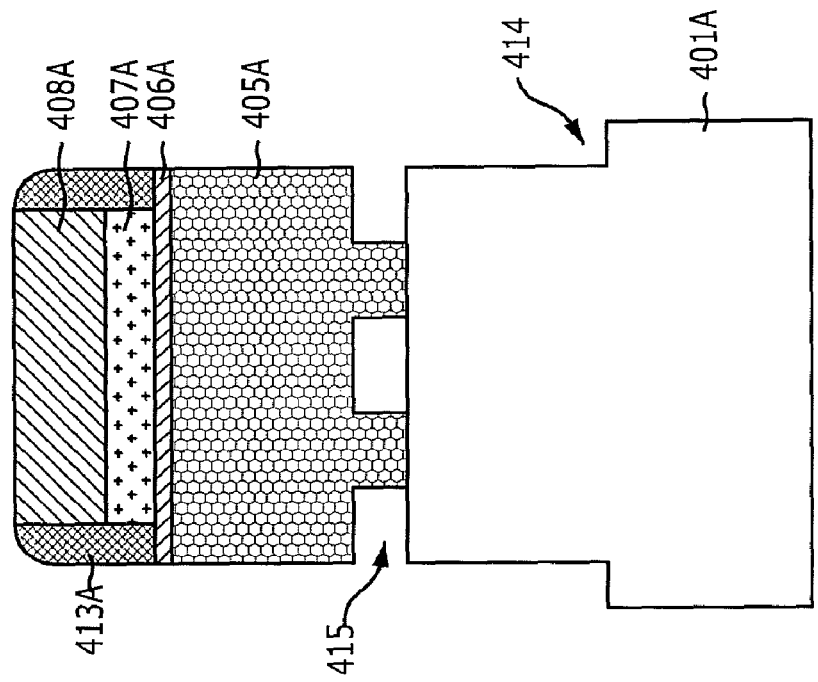
Figure 12A:
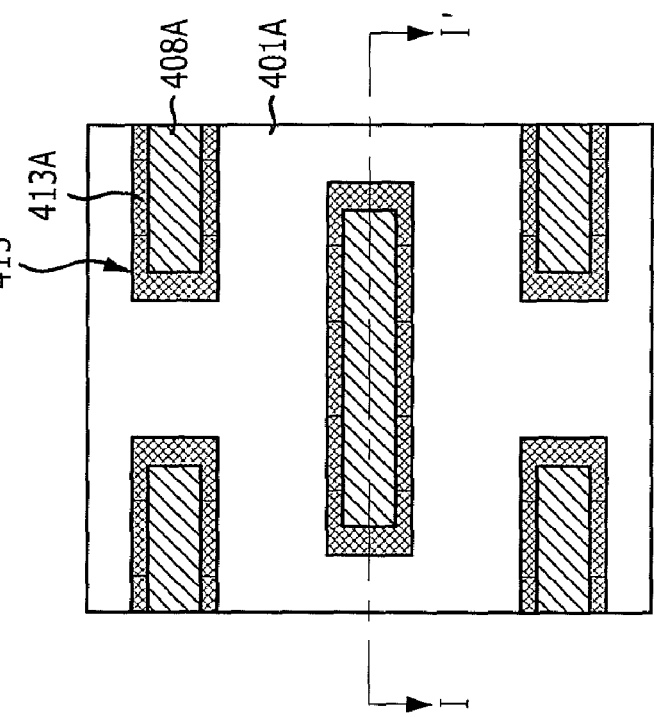

Referring to FIGS. 12A and 12B, the exposed etched sacrificial pattern 402B (shown in FIGS. 11A and 11B) is removed. For instance, the etched sacrificial pattern 402B may be removed using a wet etch with phosphoric acid ($H_4PO_3$).

After removing the etched sacrificial pattern 402B, portions where the etched sacrificial pattern 402B used to be become spaces 415.

In particular, the pad nitride pattern 407A may not be lost when removing the etched sacrificial pattern 402B because the pad nitride pattern 407A is protected by the oxide-based spacer patterns 413A and the hard mask oxide pattern 408A.

Figure 13A:
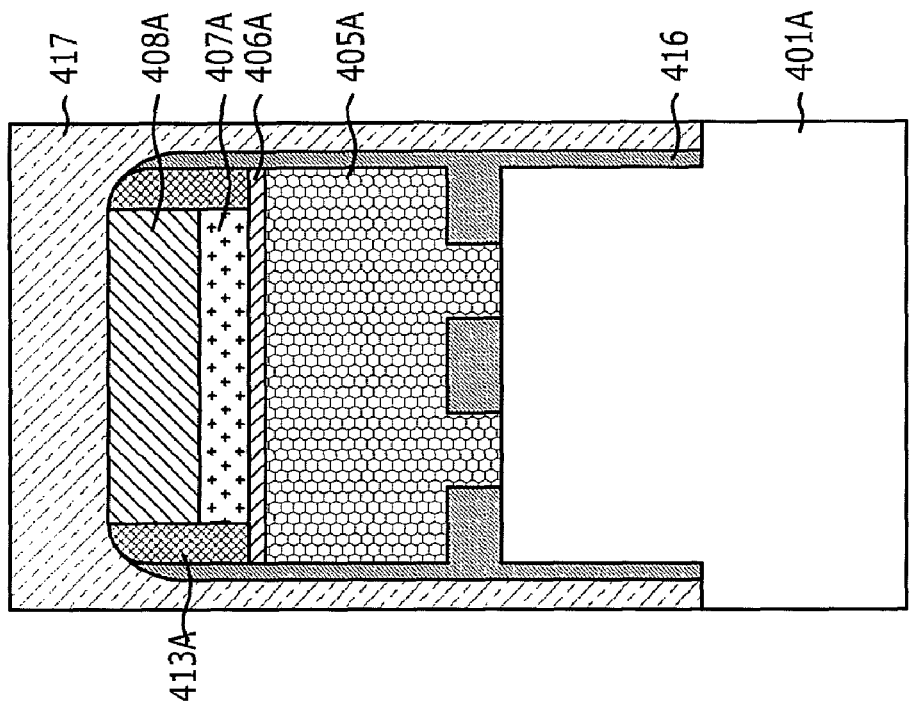
Figure 13B:
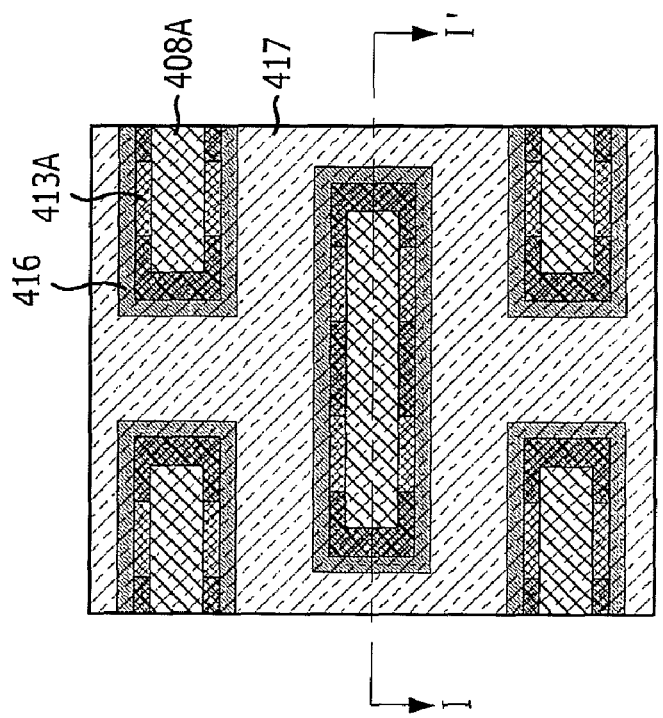

Referring to FIGS. 13A and 13B, passivation layers 416 are formed over the surface profile of the spaces 415 (shown in FIGS. 12A and 12B) and the trenches 414. The passivation layers 416 may include a stack structure of a sidewall oxide layer and a liner nitride layer. In particular, the spaces 415 are substantially filled by the passivation layers 416, thereby forming a partial SOI.

An insulation layer 417 is formed over the substrate structure, filling the trenches 414. The insulation layer 417 includes an oxide-based layer. In particular, the insulation layer 417 may include one of a spin on dielectric (SOD) layer, a high density plasma (HDP) oxide layer, and a stack structure including both an SOD layer and a HDP oxide layer.

Referring to FIGS. 14A and 14B, the insulation layer 417 (shown in FIGS. 13A and 13B) is etched and polished until a surface of the pad nitride pattern 407A is exposed to form device isolation regions 417A. At this time, the polishing process may include performing a CMP process.

During the polishing process, the passivation layers 416 and the spacer patterns 413A are polished in a manner that remaining portions of the passivation layers 416 and the spacer patterns 413A have substantially the same height as the pad nitride pattern 407A. Reference numbers 416A and 413B represent remaining passivation layers 416A and remaining spacer patterns 413B, respectively.

Figure 15B:
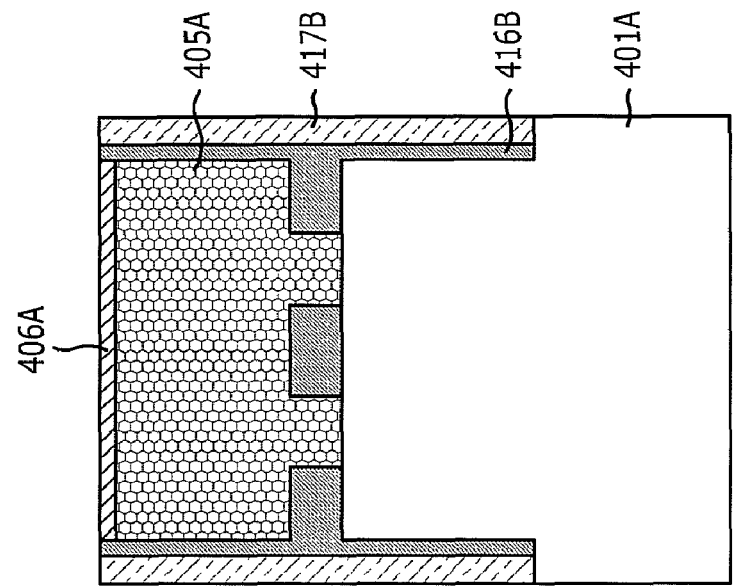
Figure 15A:
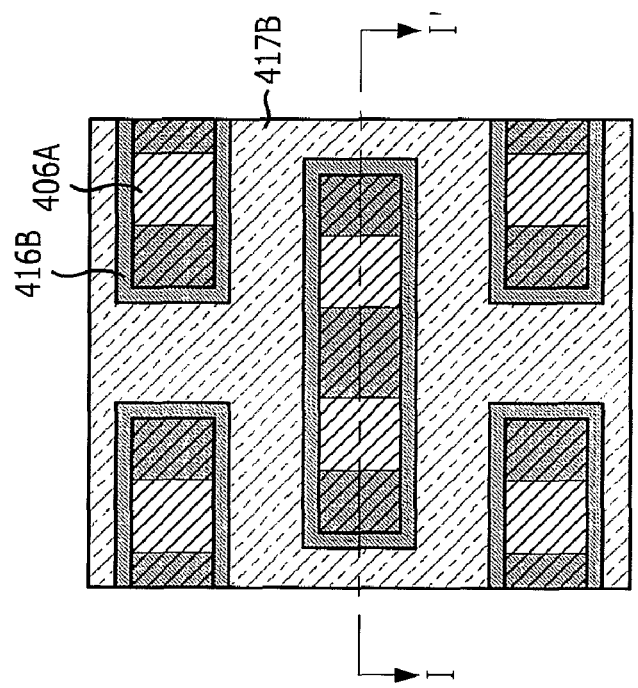

Referring to FIGS. 15A and 15B, the pad nitride pattern 407A (shown in FIGS. 14A and 14B) are removed. For instance, the pad nitride pattern 407A may be removed using phosphoric acid.

A cleaning process is performed to remove the remaining spacer patterns 413B (shown in FIGS. 14A and 14B). At this time, a certain thickness of the device isolation regions 417A and the remaining passivation layers 416A is lost. Thus, remaining portions of the device isolation regions 417A and the remaining passivation layers 416A have substantially the same height as the pad oxide pattern 406A. Reference numbers 416B and 417B represent etched passivation layers 416B and etched device isolation regions 417B, respectively.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a partial silicon-on-insulator (SOI) substrate, comprising:
    forming an insulation pattern over a first silicon layer;
    forming a second silicon layer over the substrate including the insulation pattern;
    etching the second silicon layer to form trenches; and
    forming device isolation regions filling the trenches,
    wherein the forming of the second silicon layer comprises performing an epitaxial growth.

2. The method of claim 1, wherein the forming of the insulation pattern comprises using a layer including a nonmetallic element.

3. The method of claim 1, wherein the forming of the insulation pattern comprises using an oxide-based layer.

4. The method of claim 1, wherein the epitaxial growth is performed at a temperature ranging from approximately 650° C. to approximately 900° C.

5. The method of claim 1, wherein the forming of the insulation pattern comprises forming the insulation pattern in a line type or pillar type shape.

6. The method of claim 1, wherein the etching of the second silicon layer to form the trenches comprises etching portions of the first silicon layer.

7. A method for fabricating a partial silicon-on-insulator (SOI) substrate, comprising:
    forming a sacrificial pattern including a nonmetallic element over a first silicon layer;
    forming a second silicon layer over the substrate including the sacrificial pattern;
    etching the second silicon layer to form trenches;
    removing the sacrificial pattern exposed by the trenches; and
    forming device isolation regions filling the trenches,
    wherein the forming of the second silicon layer comprises performing an epitaxial growth.

8. The method of claim 7, wherein the forming of the sacrificial pattern comprises using a nitride-based layer.

9. The method of claim 8, wherein the removing of the sacrificial pattern comprises performing a wet etch.

10. The method of claim 9, wherein the removing of the sacrificial pattern comprises using phosphoric acid.

11. The method of claim 7, wherein the epitaxial growth is performed at a temperature ranging from approximately 650° C. to approximately 900° C.

12. The method of claim 7, wherein the etching of the second silicon layer to form the trenches comprises:
    forming a hard mask pattern over the second silicon layer;
    forming spacer patterns over sidewalls of the hard mask pattern; and
    etching the second silicon layer and the first silicon layer using the hard mask pattern and the spacer patterns.

13. The method of claim 12, wherein the forming of the spacer patterns comprises using a material having a low wet etch rate with respect to the sacrificial pattern.

14. The method of claim 7, wherein the etching of the second silicon layer to form the trenches comprises etching portions of the first silicon layer.

15. The method of claim 7, wherein the forming of the sacrificial pattern comprises forming the sacrificial pattern in a line type or pillar type shape.

16. A method for fabricating a partial silicon-on-insulator (SOI) substrate, comprising:
    forming an insulation pattern to partially cover a first silicon layer;
    forming a second silicon layer over the insulation pattern and other areas of the substrate;
    etching the second silicon layer to form trenches;
    forming a passivation layer over side surfaces of the trenches; and forming, over the passivation layer, device isolation regions to fill the trenches, wherein the forming of the second silicon layer comprises performing an epitaxial growth.

17. The method of claim 16, wherein the forming of the passivation layer includes removing the insulation pattern and forming the passivation layer in spaces previously occupied by the removed insulation pattern.

18. The method of claim 16, wherein the forming of the passivation layer includes forming the passivation layer over the insulation pattern.

* * * * *